United States Patent [19]

Gloanec et al.

[11] Patent Number: 4,568,843
[45] Date of Patent: Feb. 4, 1986

[54] BISTABLE LOGIC DEVICE, OPERATING FROM DC TO 10 GHZ, AND FREQUENCY DIVIDER INCLUDING THIS BISTABLE DEVICE

[75] Inventors: Maurice Gloanec; Georges Bert; Ernesto Perea, all of Paris, France

[73] Assignee: Thomson CSF, Paris, France

[21] Appl. No.: 505,175

[22] Filed: Jun. 17, 1983

[30] Foreign Application Priority Data

Jun. 29, 1982 [FR] France ................... 82 11403

[51] Int. Cl.⁴ ............... H03K 3/289; H03K 3/288
[52] U.S. Cl. .................... 307/291; 307/272 A; 307/279
[58] Field of Search ............ 307/272 A, 272 R, 279, 307/289, 291

[56] References Cited

U.S. PATENT DOCUMENTS 3,845,325 10/1974 Daniels et al. ............... 307/220 C

FOREIGN PATENT DOCUMENTS

A2362534 3/1978 France .

OTHER PUBLICATIONS

R. Van Tuyl et al, GaAs MESFET Logic with 4 GHz Clock Rate, IEEE Journal of Solid State Circuits, vol. SC-12, No. 5, Oct. 1977, pp. 485–496.

R. Van Tuyl et al, 4 GHz Frequency Division with GaAs MESFET IC's, IEEE International Solid State Circuits Conference, vol. 20, No. 20, pp. 198–199 and 252.

M. Cathelin et al, 5 GHz Binary Frequency Division on GaAs, Electronics Letters, vol. 16, No. 14, Jul. 1980, pp. 535–536.

*Primary Examiner*—John S. Heyman
*Attorney, Agent, or Firm*—Cushman, Darby & Cushman

[57] ABSTRACT

A bistable logic device, of the RSTT̄ type, operating up to X band. The bistable logic device is organized into three stages: an input stage of four NOR operators (21, 31, 41, 51), a second stage of two OR operators (61, 71) and an output stage of two OR operators (62, 72). Each NOR operator of the input stage drives in parallel an OR operator of the second stage and an OR operator of the output stage. Each of the four OR operators are fed back to an input of one of the four NOR operators of the input stage. The organization in logic NOR/OR form makes it possible to use faster single gate transistors. The present invention may be particularly useful to frequency dividers for interfacing between signals at GHz frequency and measurement and control circuits at MHz frequency.

6 Claims, 9 Drawing Figures

BISTABLE LOGIC DEVICE, OPERATING FROM DC TO 10 GHZ, AND FREQUENCY DIVIDER INCLUDING THIS BISTABLE DEVICE

BACKGROUND OF THE INVENTION

The present invention relates to a very fast bistable logic device whose structure has been designed with a view to simplifying the internal organization of the bistable logic device and to improving its performance, especially in the very high frequencies between 5 and 10 GHz. It also relates to the application of this bistable logic device to a divide by 2 frequency divider operating from DC to a frequency of 10 GHz, this frequency divider being manufactured especially in the form of an integrated circuit on gallium arsenide. The development of microwave microelectronics, that is to say, microelectronics produced on new materials of the gallium arsenide type and on other derivatives of materials from the III-V and II-VI families, has required the parallel development of means of control and processing of the microwave signals. In fact, control and processing means or units in the form of integrated circuits working at maximum frequencies on the order of some hundreds of MHz are generally associated with a microwave system. For example, circuits on silicon are often associated with a microwave device on gallium arsenide in the technology called ECL. It is therefore necessary to interface the part of the system which works at microwave frequencies, generated by circuits on gallium arsenide, and the part of the system which works with circuits made on silicon, and consequently to make a frequency division to reduce GHz to MHz.

Without questioning the method of transposition of frequency according to which a given frequency is measured relative to local frequencies generated by very highly stable local oscillators, the present-day technical solutions are tending towards frequency division, which proves to be very advantageous on condition that the divider circuits:

operate at very high frequencies, of at least 1 GHz, that is to say at least twice the frequency of the highest performance present-day techniques;

operate in a high frequency band, so that there is no value in resorting to local reference oscillators; and have their output frequency compatible with that of traditional integrated circuits, that is to say the division ratios are sufficiently large. The change from a frequency in GHz to a frequency in MHz is achieved by a succession of dividers of sufficient number.

In the field of division of periodic frequency, very advantageous results have been obtained in the 5 to 15 GHz band by means of structures using planar Gunn diodes. However, these dividers of periodic frequencies have the disadvantage of having a relatively narrow operating bandwidth, since $\Delta f/f$ is approximately $\simeq 10\%$. The highest performance aperiodic frequency dividers work in a wider frequency band but need the application of two complementary signals, which is no disadvantage since the complementary signal is easy to generate.

Present day known frequency dividers work up to frequencies of 5.5 GHz: it is therefore necessary to bring about an advancement of the order of 2 at least for a new structure to offer advantages. It is this result which is covered by the frequency divider according to the invention.

SUMMARY OF THE INVENTION

The frequency divider according to the invention, and hence the bistable device which is the basis for producing a divider, has been designed with a double objective. On the one hand its electrical block diagram has been optimized in order to simplify it, by reducing the number of stages, thus giving a reduction in the propagation time across the stages and consequently an increase in the maximum operating frequency. In addition, it is necessary for the logic block diagram retained to be compatible with the most advanced technique, especially as regards the dimensioning of the components and their production on fast materials of the gallium arsenide family and III-V compounds. In fact, when operating frequencies of a microelectronic device are counted in GHz, the component dimensioning, that is to say, for example, the gate length of a field effect transistor, assumes a size which is not negligible since, in certain cases, it is not known how to make sufficiently fine gates, because of the limits of the mask techniques, although this example is only cited to indicate the importance of true compatibility between an electrical block diagram and its implementation.

The performance of the bistable device is due to its structure which groups logic operators of the NOR-/OR type, the association of these two types of operators making simplification to the block diagram possible. These simplifications are rendered possible by redundancies among operators which have made it possible to have only three stages of operators instead of four between the bistable device input and output.

More precisely, the invention relates to a bistable logic device operating from DC to 10 GHz, having two inputs to which two complementary signals at frequency $f_i$ are routed, and two outputs which supply complementary signals at frequency $f_i/2$, which is composed of 4 logic NOR operators and 4 logic OR operators organized in three stages, the NOR operators constituting the input stage, and the OR operators constituting the intermediate and output stages, these two latter stages being fed back to the input stage.

BRIEF DESCRIPTION OF THE DRAWINGS

The invention will be better understood on reading the description of the fast bistable device which refers to the annexed figures which show.

DESCRIPTION OF THE PREFERRED EMBODIMENT

In order to divide frequencies in the ranges 5 to 10 GHz, it is obvious that recourse to the most advanced techniques is necessary and that these frequency dividers are made with high performance field effect transistors and most often according to a technology called buffered field effect transistor logic (BFL). The highest performance aperiodic frequency dividers are obtained by feedback on a master-slave bistable device called RS, shown in FIG. 1.

To represent this feedback bistable device, international symbols are retained and this bistable is composed of two elementary RST bistables. The master elementary bistable, identified as Ma, receives a signal T at its input and issues, on its two complementary outputs Q and $\overline{Q}$, signals applied to the two R and S inputs of the slave elementary bistable identified as Sc. The two outputs Q and $\overline{Q}$ of the slave operator are in part fed back to the two inputs S and R of the master elementary operator Ma. The input R corresponds to the reset (reset to 0) and the input S corresponds to the set (set to 1). Outputs Q and $\overline{Q}$ are called complementary. If a signal at a frequency $f_i$ is applied to the input I on pin T of the master operator, a signal of frequency $f_i/2$ is available at the output of the operators.

Figure 1:
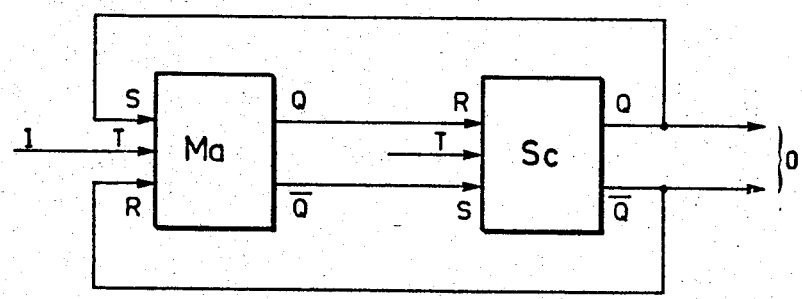
FIG. 1: simplified logic block diagram of a bistable device of the RST master-slave type according to the known art.

In fact, FIG. 1 is a simplified logic block diagram and each operator has two stages, each stage having a switching time $t_{pd}$ which makes the switching time of the master operator $2t_{pd}$, the switching time of the slave operator $2t_{pd}$ and the maximum operating frequency of an RST bistable device is $\frac{1}{4}t_{pd}$ assuming that the propagation times in the master operator and in the slave operator are the same.

Figure 2:
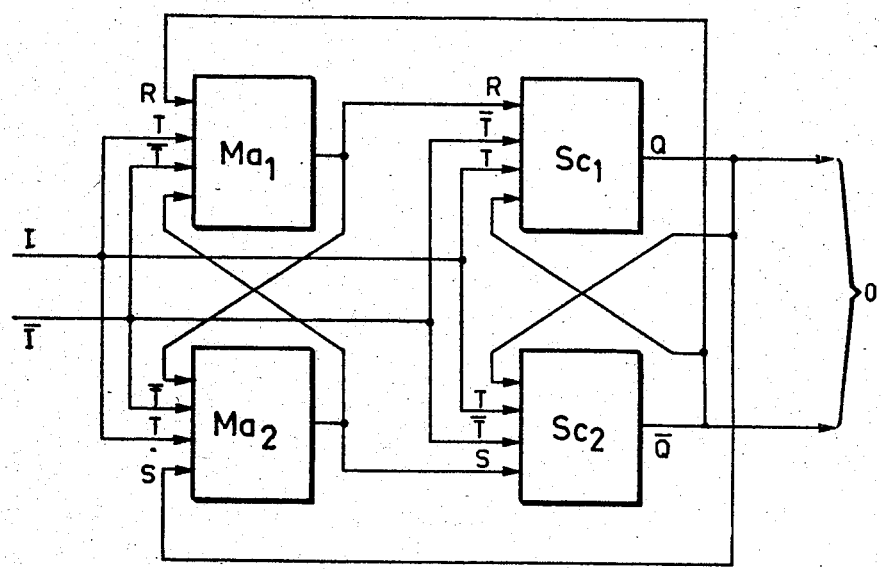
FIG. 2: logic block diagram of a bistable device of the RSTT̄ master-slave type.

An improvement which makes it possible to double the maximum frequency of a divider, apart from the fact that the master and slave operators are identical, consists in using a clocked inhibition of the gates, that is to say in having a bistable device of the RST$\overline{T}$ type, in which $\overline{T}$ is the complementary signal to the T input signal. As a result of the feedback, the switching time is no more than $1t_{pd}$ for the master operator and $1t_{pd}$ for the slave operator, and the maximum frequency of operation is $\frac{1}{2}t_{pd}$. FIG. 2 shows such a feedback bistable device with clocked inhibition of its gates.

Without entering into the details of such a bistable device which forms part of the known art, it is seen that it is composed of four complex operators, two complex master operators Ma$_1$ and Ma$_2$ on the left of the figure, and two complex slave operators Sc$_1$ and Sc$_2$ on the right of the figure. The output signals from the operators are fed back. In this case, the input signals from the two inputs I and $\overline{I}$ must necessarily be complementary.

Figure 3:
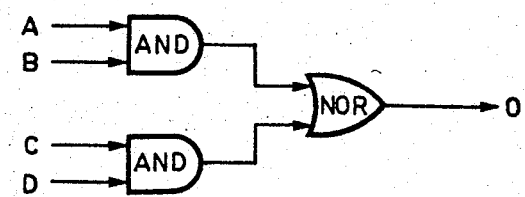
FIG. 3: logic block diagram of a complex bistable operator of the AND/NOR type.

It is this type of bistable device which is used most often for the highest performance frequency dividers produced at the present time and the architecture employed, in the known art, is shown in FIG. 3.

This bistable device uses an AND/NOR operator consisting of two AND operators whose inputs receive the signals, designated on this general logic block diagram by the names A, B, C and D, and whose outputs are applied to an elementary NOR operator. In fact, the method of producing this function, which is quite feasible for moderately high frequencies, that is to say up to 4 and 5 GHz, prevents such an operator functioning at higher frequencies.

Figure 4:
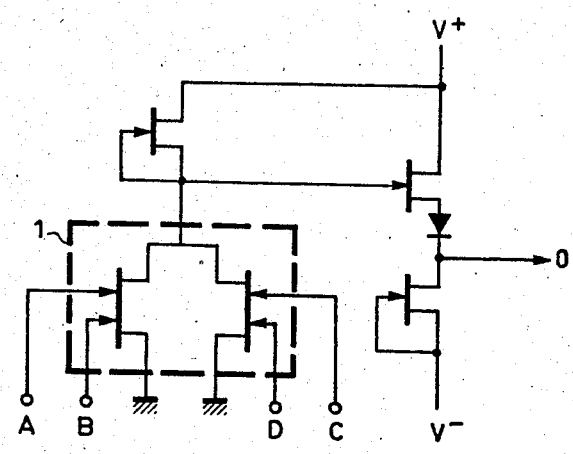
FIG. 4: electrical block diagram of the preceding complex operator.

In fact, the logic function $0=\overline{A\times B+C\times D}$ is produced by the integration of monogate transistors, dual gate transistors and shift diodes, as shown in FIG. 4, on a chip of fast material.

FIG. 4 is an electrical block diagram of the AND/NOR operator of the preceding figure. It is the assembly of the two AND operators of the bistable device which limits the operating speed of this device. These two operators, which on FIG. 4 are surrounded by a rectangle of dotted lines identified as 1, are each composed, as far as is relevant, of a two-gate field effect transistor, each gate constituting one of the two inputs of an AND gate. Now, on the one hand the designed frequency divider must work at very high frequencies, such as 10 GHz, which requires that the transistors are of extremely small dimensions, and their gates are of even smaller dimensions and they thus reach the limits of technology. On the other hand, the method of operating a field effect transistor with a single gate which controls the passage of current between the two electrodes, called source and drain, is very well known. In contrast, the method of controlling the operation of a dual gate transistor is less well known, and controlling the operation of a transistor with more than 2 gates is not known at all. Now, it is advantageous in certain cases to have more than two inputs. It is therefore necessary to seek an operator structure such that it does not use any AND gate, so as to avoid having dual gate transistors, and yet could have a large of number of inputs, greater than 2.

By way of comparison and example, the frequency dividers according to the known art currently operate at maximum operating frequencies ranging from 4.1 GHz, for field effect transistor gate lengths of 1.2 microns, up to a frequency of 5.7 GHz for gate lengths of 0.8 micron. To go beyond these frequencies therefore necessitates a change in the design and layout of the bistable device.

Figure 5:
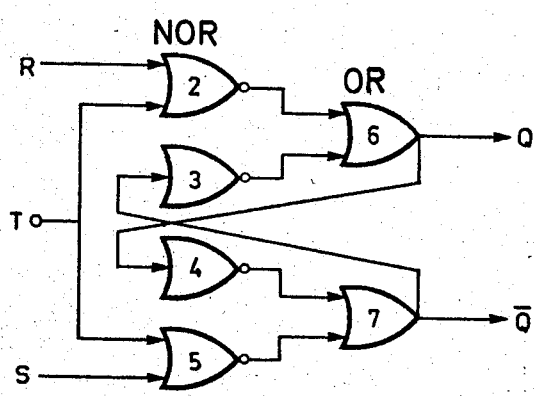
FIG. 5: logic block diagram of a complex NOR/OR operator.

Among the structures of possible bistable devices which may be produced in buffered field effect technology (BFL), a complex operator of the NOR/OR type is particularly advantageous. It is this which is shown in FIG. 5.

Figure 6:
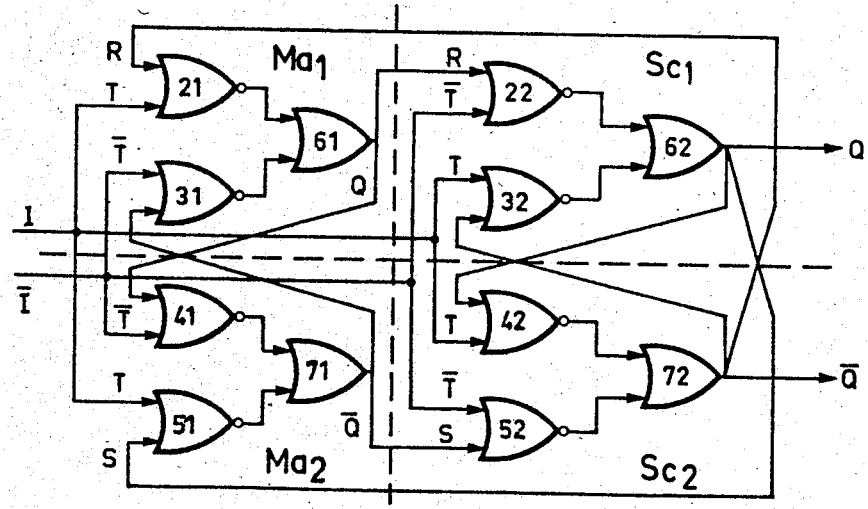
FIG. 6: logic block diagram of a divide by 2 circuit grouping together two bistable devices of the RSTT̄ type designed from complex NOR/OR operators.

This RST type bistable device is composed of four NOR operators, 2, 3, 4 and 5, and of two OR operators 6 and 7. The input signal T is applied to the two NOR operators 2 and 5, which also receive signals R and S respectively. The two NOR operators 3 and 4 receive the output signals Q and $\overline{Q}$ fed back from the OR operators 6 and 7. The application of this RST bistable device using NOR operators and OR operators is illustrated in FIG. 6 which shows a bistable device of the RST$\overline{T}$ type. A comparison must be made between the bistable device in FIG. 2 and that in FIG. 6.

In fact, whereas the bistable device in FIG. 2 used two master complex operators Ma$_1$ and Ma$_2$ and two slave complex operators Sc$_1$ and Sc$_2$, the same master-slave configuration is found in the bistable device in FIG. 6, divided in the drawing by two dotted lines which delimit the master and slave operators. The master operator Ma$_1$ is composed of the elementary operators 21, 31 and 61, and the master operator Ma$_2$ is composed of the elementary operators 41, 51 and 71. The slave complex operator Sc$_1$ is composed of the elementart operators 22, 32 and 62, and the slave complex operator Sc$_2$ is composed of the elementary operators 42, 52 and 72.

These operators are fed back on each other, they receive complementary signals T and $\overline{T}$, and issue output signals Q and $\overline{Q}$ in much the same way as the bistable device in FIG. 2.

Figure 7:
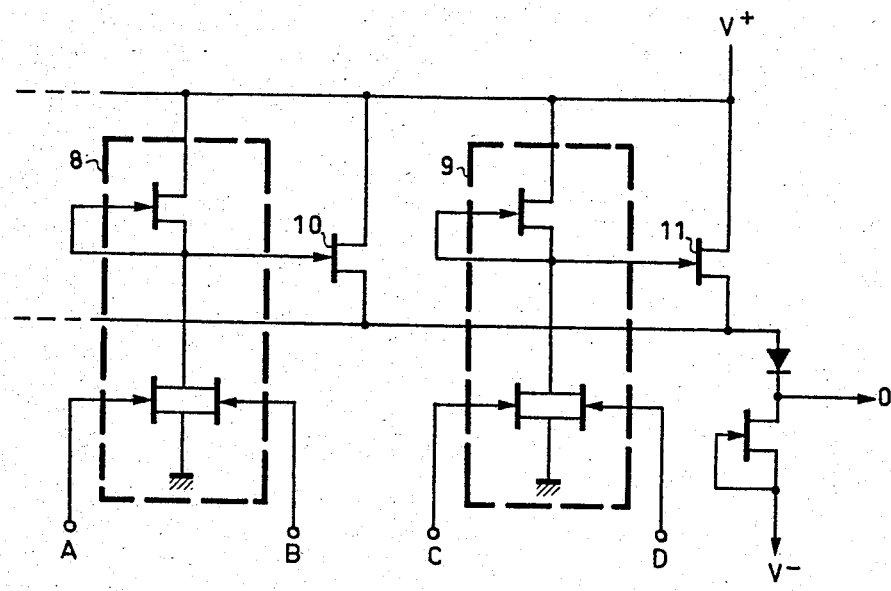
FIG. 7: electric block diagram of a complex NOR-/OR operator.

However, the bistable device in FIG. 6 is composed of the operators NOR and OR, according to the logic block diagram in FIG. 5, and this configuration makes it possible to use transistors with a single gate in the real integration on a semiconductor chip, as shown in the electrical block diagram in FIG. 7.

In this electrical block diagram, two NOR operators, represented by the three transistors enclosed by a dotted line and identified by 8 and 9, and an OR operator composed of the assembly of two transistors 10 and 11 are seen. The first advantage of this type of structure is that the transistors used in the NOR operators, for the inputs identified by A, B, C and D, are single gate transistors, that is to say that it will be possible to make gates of much smaller dimensions corresponding to greater frequencies. The second advantage is that the NOR and OR functions are separate and this advantage will be shown later.

A divide by 2 circuit composed of the bistable device according to FIG. 6 makes it possible to gain 15% in operating speed relative to the divider using AND/NOR operators for the same power dissipation, that is to say 20 milliwatts per operator. The operating frequency therefore changes to 4.7 GHz in comparison with 4.1 GHz which corresponded to a divide by 2 circuit according to FIG. 2.

However, it may be noted that the bistable device in FIG. 6 has four elementary operator stages, that is to say a first stage of NOR operators, 21, 31, 41, 51, a second stage of OR operators 61, 71, a third stage of NOR operators 22, 32, 42, 52, and a fourth stage of OR operators 62, 72. This means that the switching time across the bistable device is equal to the sum of the switching times across each of the four stages.

It is possible to improve the total switching time of the bistable device, that is to say its operating frequency, if this bistable device can be simplified in order to reduce the number of stages. It is the aim of the invention, by simplifying the bistable device in FIG. 6, to produce a bistable device having no more than three stages, giving a gain of 30% in frequency if the switching times for each stage are considered equal.

In fact, a certain number of redundancies can be considered which make it possible to delete some elementary operators from the complemented bistable device in FIG. 6. The OR operator 61 of the second stage issues on its output a signal which is applied simultaneously to the NOR operators 41 of the first stage and 22 of the third stage: it will suffice to retain only one of these two. In the same way, the OR operator 71 of the second stage issues on its output a signal applied simultaneously to the NOR operators 31 of the first stage and 52 of the third stage; the same simplification will be effected. In addition, OR operator 62 of the fourth stage issues on its output a signal applied in parallel to the NOR operator 51 of the first stage and to the NOR operator 42 of the third stage. Finally, OR operator 72 of the fourth stage issues simultaneously a signal to NOR operator 21 of the first stage and to NOR operator 32 of the third stage.

It can be seen therefore that the four OR operators 61, 62, 71 and 72 each issue signals to two identical NOR operators of the first and of the third stages. There is therefore a redundancy between the first and the third stage, and it is possible to delete the third stage to make the bistable device more compact: this is shown in FIG. 8.

Figure 8:
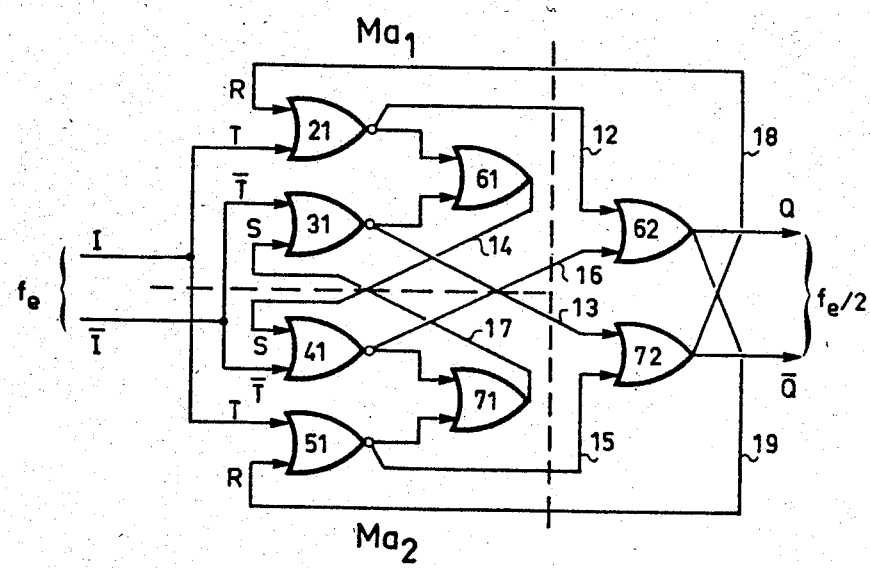
FIG. 8: logic block diagram of a divide by 2 circuit according to the invention.

In order to facilitate the comparison between FIG. 8 and FIG. 6, the same identification numbers have been retained when they denote the same elementary operators.

Since the elementary NOR operators of the third stage on FIG. 6 all have functions parallel to those of the elementary operators of the first stage, the operators of the third stage are deleted, which makes is possible to reduce the overall propagation time of the circuit.

The divide by 2 circuit according to the invention therefore appears to be composed essentially of two complex operators Ma$_1$, Ma$_2$ which control two elementary OR operators 62 and 72. The complex operators Ma1, Ma2 are delineated on FIG. 8 by two dotted lines and their nomenclature of Ma$_1$, Ma$_2$ is retained for analogy with FIG. 6 since these complex operators are composed of the same complementary operators. Likewise, the two OR output operators are those which constitute the fourth stage of the divide by 2 circuit in FIG. 6.

Each of the two complex operators Ma$_1$, Ma$_2$ is composed of two NOR operators (21, 31) whose two outputs control an OR operator (61). In parallel, output 12 of the first NOR operator (21) of the first stage controls an input of the first OR operator (62) of the third stage, and output 13 of the second NOR operator (31) of the first stage controls an input of the second OR operator (72) of the third stage.

Output 14 of the first OR operator (61) of the second stage is fed back to an input of the third NOR operator (41) of the first stage.

The interconnection block diagram is symmetrical for the second complex operator Ma$_2$ composed of operators 41, 51, 71.

Output 18 of the OR operator (72) of the third stage is fed back to an input of the first NOR operator (21) of the first stage, and the output 19 of the OR operator (62) of the third stage is fed back to an input of the fourth NOR operator (51) of the first stage.

The complex operators Ma$_1$, Ma$_2$ constitute the first and the second stage of the divide by 2 circuit according to the invention. The outputs of OR operators 62 and 72 issue complementary signals Q and $\overline{Q}$, whose frequency is half that of the input frequency on the complementary inputs I and $\overline{I}$.

There are many advantages of such a divide by 2 structure:

circuit simplification, since there are no more than 24 single gate transistors in place of 36;

reduction in input loading of the device;

reduction in output loading of the device with increase in speed performance; and reduction in power consumption allied to the deletion of four inverting stages.

Thus, by way of example, the maximum frequency of the frequency divider according to the invention is 6.25 GHz for an equivalent power per gate of 15 mw, which already corresponds to an increase of 33% relative to the divider of the known art. However, by total optimization of the circuit parameters, and in particular of the dimensioning of transistors, with gates of 0.3 micron in length, the improved performance of the divider according to the invention reaches 10 GHz: in this case, the equivalent power per gate is 53 mw.

Figure 9:
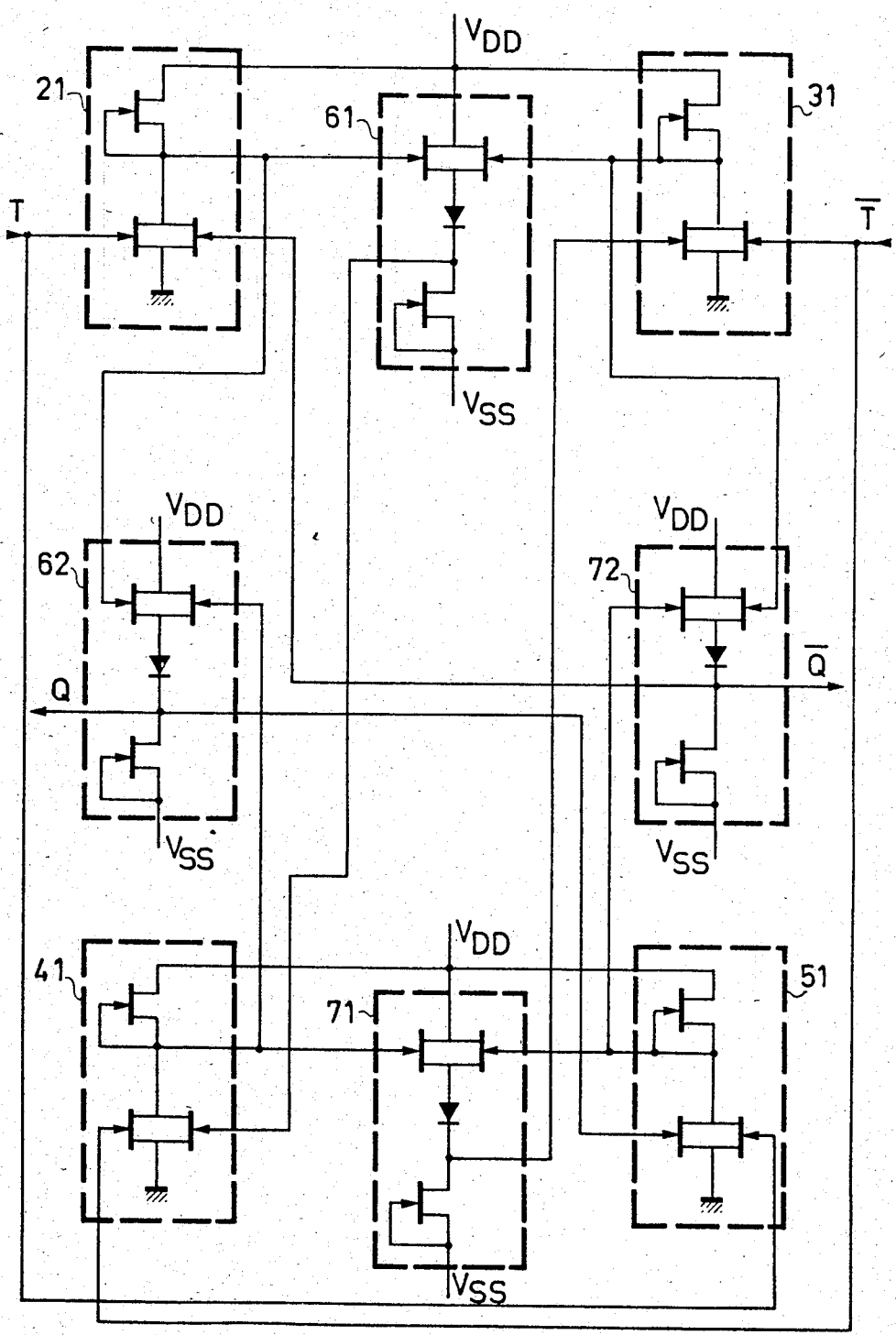
FIG. 9: electrical block diagram of a divide by 2 circuit according to the invention.

FIG. 9 shows the electrical block diagram of the bistable device according to the invention and the assemblies of components which constitute elementary operators are enclosed by a dotted line to facilitate their identification. The NOR operators 21, 31, 41, and 51 are in the four corners of the figure and they constitute the first stage of the divide by 2 circuit. The OR operators 61 and 71 are disposed on the mid-vertical axis of the figure and they constitute the second stage of the divide by 2 circuit. The OR operators 62 and 72 are disposed on the mid-horizontal axis of the figure and they constitute the third stage of the divide by 2 circuit. It is seen that, as in FIG. 8, the inputs which deliver complementary signals T and $\overline{T}$ are routed to the four operators of the first stage 21, 31, 41 and 51 and that the outputs Q and $\overline{Q}$ which are at half the input frequency of signals T and $\overline{T}$, are issued on the outputs of operators 62 and 72. The operators of the first, second and third stages are in a feedback loop in accordance with FIG. 8.

The RST$\overline{T}$ type bistable device according to the invention has been developed in order to produce a divide by 2 frequency divider characterized by a very wide operating band since its operation has been controlled between DC and X band, that is to say 10 GHz. This circuit finds application in the interfaces between very high frequencies measured in GHz, and the control or analyzing systems operating at lower frequencies measured in MHz. This result has been obtained by abandoning the bistable structure of the AND/NOR type generally used in favor of a NOR/OR structure which permits a technological simplification and consequently a gain in performance.

It is obvious to the man skilled in the art that the production of frequency dividers of an order greater than 2 is achieved from a succession of divide by 2 frequency dividers according to the invention, and that the technological data which have been cited, such as the logic technology of buffered field effect transistors, or the length of the gates used, would in no instance restrict the scope of the invention which applies to a bistable structure using NOR/OR operators and can be produced in technologies other than those which have been mentioned by way of example. The present invention of a bistable device and a divide by 2 frequency divider is specified by the following claims.

We claim:

1. A bistable logic device having an operating frequency from DC to 10 GHz, comprising:
   two inputs I and $\overline{I}$, receiving complementary input signals T and $\overline{T}$ at frequency $f_i$;
   two outputs providing complementary output signals Q and $\overline{Q}$ at frequency $f_i/2$;
   a first stage receiving said input signals and having four NOR gates;
   a second stage connected to said first stage and having two OR gates; and
   a third stage connected to said first stage and having two OR gates, said third stage providing said output signals,
   wherein each said NOR gate has an output connected to one OR gate from said second stage and to one OR gate from said third stage.

2. A device according to claim 1 wherein said NOR gates include first, second, third and fourth NOR gates, and wherein said second stage OR gates include first and second OR gates, outputs of said first and second NOR gates being connected to inputs of said first OR gate, outputs of said third and fourth OR gates being connected to inputs of said second OR gate, output of said first OR gate being connected to an input of said third NOR gate, and output of said second OR gate being connected to an input of said second NOR gate.

3. Apparatus according to claim 2 wherein said third stage OR gates include third and fourth OR gates, inputs of said third OR gate being connected to outputs of said first and third NOR gates, inputs of said fourth OR gate being connected to outputs of said second and fourth OR gates, output of said third OR gate being connected to an input of said fourth NOR gate, and output of said fourth OR gate being connected to an input of said first NOR gate.

4. Apparatus according to claim 3 wherein said first and fourth NOR gates receive said input signal T, and said second and third NOR gates receive said input signal $\overline{T}$, and wherein said third OR gate provides said output signal Q and said fourth OR gate provides said output signal $\overline{Q}$.

5. A device according to claim 1 integrated with single gate transistors in a monnolithic circuit on a semiconductor crystal.

6. A frequency divider, functioning in the range 0 to 10 GHz, which contains at least one logic bistable device as claimed in claim 1.

* * * * *